(12) United States Patent  
Chang et al.

(10) Patent No.: US 8,883,645 B2  
(45) Date of Patent: Nov. 11, 2014

(54) NANOPILLAR FIELD-EFFECT AND JUNCTION TRANSISTORS

(71) Applicant: California Institute of Technology, Pasadena, CA (US)

(72) Inventors: Chieh-Feng Chang, Pasadena, CA (US); Aditya Rajagopal, Irvine, CA (US); Axel Scherer, Barnard, VT (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/941,240

(22) Filed: Jul. 12, 2013

(65) Prior Publication Data

US 2014/0134819 A1    May 15, 2014

Related U.S. Application Data

(60) Provisional application No. 61/724,618, filed on Nov. 9, 2012.

(51) Int. Cl.
| | | |
|---|---|---|
| *H01L 21/311* | (2006.01) | |
| *H01L 29/66* | (2006.01) | |
| *H01L 29/423* | (2006.01) | |
| *H01L 29/06* | (2006.01) | |

(52) U.S. Cl.
CPC ...... *H01L 29/66477* (2013.01); *H01L 29/4232* (2013.01); *H01L 29/0673* (2013.01)
USPC ............. 438/695; 216/41; 216/46; 216/49; 216/51; 216/54; 257/E21.023; 257/E21.035; 257/E21.039; 257/E24.024; 257/E29.2; 438/184; 438/228; 438/267; 438/301; 438/696

(58) Field of Classification Search
None
See application file for complete search history.

(56) References Cited

U.S. PATENT DOCUMENTS

| | | | |
|---|---|---|---|
| 4,825,081 A | 4/1989 | Wille et al. | |
| 5,545,980 A | 8/1996 | Nakamoto | |
| 6,130,098 A | 10/2000 | Handique et al. | |
| 6,255,976 B1 | 7/2001 | Watanabe et al. | |
| 6,437,554 B1 | 8/2002 | Atwater et al. | |
| 6,475,890 B1 | 11/2002 | Yu | |
| 6,605,519 B2 | 8/2003 | Lishan | |
| 6,754,950 B2 | 6/2004 | Furukawa et al. | |
| 6,836,578 B2 | 12/2004 | Kochergin et al. | |

(Continued)

FOREIGN PATENT DOCUMENTS

| | | |
|---|---|---|
| JP | 05-243588 | 9/1993 |
| JP | 2001-250967 | 9/2001 |

(Continued)

OTHER PUBLICATIONS

S. Walavalkar et al., "Tunable Visible and Near-IR Emission from Sub-10 nm Etched Single-Crystal Si Nanopillars," Nano Lett. 10, pp. 4423-4428 (2010).

(Continued)

*Primary Examiner* — Yasser A Abdelaziez
(74) *Attorney, Agent, or Firm* — Steinfl & Bruno, LLP

(57) ABSTRACT

Methods for fabrication of nanopillar field effect transistors are described. These transistors can have high height-to-width aspect ratios and be CMOS compatible. Silicon nitride may be used as a masking material. These transistors have a variety of applications, for example they can be used for molecular sensing if the nanopillar has a functionalized layer contacted to the gate electrode. The functional layer can bind molecules, causing an electrical signal in the transistor.

29 Claims, 8 Drawing Sheets

(56) References Cited

U.S. PATENT DOCUMENTS

| | | | |
|---|---|---|---|
| 6,963,119 | B2 | 11/2005 | Colgan et al. |
| 7,368,370 | B2 | 5/2008 | Jain et al. |
| 7,598,552 | B2 | 10/2009 | Park |
| 7,648,290 | B2 | 1/2010 | Feve et al. |
| 7,902,015 | B2 | 3/2011 | Ghozeil et al. |
| 7,923,240 | B2 | 4/2011 | Su |
| 8,017,938 | B2 | 9/2011 | Gomez et al. |
| 8,114,787 | B2 | 2/2012 | Kruglick |
| 8,208,502 | B2 | 6/2012 | Srinivasan et al. |
| 8,355,768 | B2 | 1/2013 | Masmanidis et al. |
| 8,410,568 | B2 | 4/2013 | Steinbrueck et al. |
| 2003/0090161 | A1 | 5/2003 | Marlow et al. |
| 2003/0099273 | A1 | 5/2003 | Murry et al. |
| 2007/0109121 | A1 | 5/2007 | Cohen |
| 2007/0116082 | A1 | 5/2007 | Feve et al. |
| 2007/0187632 | A1 | 8/2007 | Igarashi |
| 2008/0039770 | A1 | 2/2008 | Francis et al. |
| 2009/0015141 | A1 | 1/2009 | Wang et al. |
| 2009/0321633 | A1 | 12/2009 | Blick et al. |
| 2010/0019778 | A1 | 1/2010 | Park et al. |
| 2010/0248209 | A1 | 9/2010 | Datta et al. |
| 2010/0268078 | A1 | 10/2010 | Scarantino et al. |
| 2011/0044694 | A1 | 2/2011 | Scherer et al. |
| 2011/0049650 | A1 | 3/2011 | Tiwari et al. |
| 2011/0218490 | A1 | 9/2011 | Ocvirk et al. |
| 2011/0237000 | A1 | 9/2011 | Tey et al. |
| 2011/0288391 | A1 | 11/2011 | Rao et al. |
| 2012/0161207 | A1 | 6/2012 | Homyk et al. |
| 2012/0256492 | A1 | 10/2012 | Song et al. |
| 2013/0207639 | A1 | 8/2013 | Rajagopal et al. |
| 2013/0230063 | A1 | 9/2013 | Kim et al. |
| 2014/0030819 | A1 | 1/2014 | Rajagopal et al. |
| 2014/0070286 | A1 | 3/2014 | Rajagopal et al. |
| 2014/0072993 | A1 | 3/2014 | Rajagopal et al. |
| 2014/0103735 | A1 | 4/2014 | Chang et al. |

FOREIGN PATENT DOCUMENTS

| | | |
|---|---|---|
| JP | 2004-363594 | 12/2004 |
| JP | 2006-266846 | 10/2006 |
| JP | 2006-267477 | 10/2006 |
| KR | 10-1999-0028493 | 4/1999 |
| KR | 10-0781545 | 12/2007 |
| KR | 10-0906270 | 7/2009 |
| KR | 10-2010-0048380 | 5/2010 |
| KR | 10-2010-0065974 | 6/2010 |
| KR | 10-2012-0021683 | 3/2012 |
| WO | 2012-092209 | 7/2012 |

OTHER PUBLICATIONS

PCT International Search Report mailed on Oct. 1, 2013 for PCT/US2013/050355 filed on Jul. 12, 2013 in the name of California Institute of Technology.
PCT Written Opinion mailed on Oct. 1, 2013 for PCT/US2013/050355 filed on Jul. 12, 2013 in the name of California Institute of Technology.
PCT International Search Report mailed on Oct. 15, 2013 for PCT/US2013/050367 filed on Jul. 12, 2013 in the name of California Institute of Technology.
PCT Written Opinion mailed on Oct. 15, 2013 for PCT/US2013/050367 filed on Jul. 12, 2013 in the name of California Institute of Technology.
International Search Report issued for PCT Application No. PCT/US2013/034315 filed on Mar. 28, 2013 in the name of California Institute of Technology. mail date: Jan. 28, 2014.
Written Opinion issued for PCT Application No. PCT/US2013/034315 filed on Mar. 28, 2013 in the name of California Institute of Technology. mail date: Jan. 28, 2014.

International Search Report issued for PCT Application No. PCT/US2013/034297 filed on Mar. 28, 2013 in the name of California Institute of Teciinology. mail date: Jan. 24, 2014.
Written Opinion issued for PCT Application No. PCT/US2013/034297 filed on Mar. 28, 2013 in the name of California Institute of Technology. mail date: Jan. 24, 2014.
International Search Report mailed on May 16, 2013 issued for PCT/US2013/025632 filed Feb. 11, 2013 in the name of California Institute of Technology.
Written Opinion mailed on May 16, 2013 issued for PCT/US2013/025632 filed Feb. 11, 2013 in the name of California Institute of Technology.
International Search Report mailed on Apr. 20, 2011 for PCT/US2010/046220 filed Aug. 20, 2010 in the name California Institute of Technology et al.
Written Opinion mailed on Apr. 20, 2011 for PCT/US2010/046220 filed Aug. 20, 2010 in the name California Institute of Teciinology et al.
W. Andre, et al., "Micro-photovoltaic Cells Designed for Magnetotaxis-based Controlled Bacterial Microrobots", IEICE Electronics Express, 2008, 5: 101-106.
Fujita, et al., "Continuous wave lasing in GaInAsP microdisk injection laser with threshold current of 40 µA", Electron. Lett., 2000, vol. 36, pp. 790-791.
N. Hempler, et al., "Pulsed pumping of semiconductor disk lasers", Mar. 19, 2007, Optics Express, 15, 6, pp. 3247-3256.
M.D. Henry, et al., "Alumina etch masks for fabrication of high-aspect-ratio silicon micropillars and nanopillars", Nanotechnology, 20, 25 (2009): 255305. Abstract Only.
K. Inoshita, et al., "Fabrication of GaInAsP/InP photonic crystal lasers by ICP etching and control of resonant mode in point and line composite defects", IEEE J. Sel. Top. Quantum Electron, 2003, vol. 9, pp. 1347-1354.
Y. Mo, et al., "Micro-machined gas sensor array based on metal film micro-heater", Sensors and Actuators B, 2001, vol. 79, pp. 175-181.
A.S. Sadek, et al., "Wiring nanoscale biosensors with piezoelectric nanomechanical resonators", Nano Lett., 2010, vol. 10, pp. 1769-1773.
R. Ushigome, et al., "GaInAsP microdisk injection laser with benzocyclobutene polymer cladding and its athermal effect", Jpn. J. Appl. Phys., 2002, vol. 41, pp. 6364-6369.
S.S. Walavalkar, et al., "Controllable deformation of silicon nanowires with strain up to 24%", Journal of Applied Physics, 107, 12 (2010): 124314-1 to 124315-5.
Restriction Requirement mailed on Sep. 20, 2013 for U.S. Appl. No. 13/764,620, filed Feb. 11, 2013, in the name of Seheon Kim.
Restriction Requirement mailed on Jun. 13, 2014 for U.S. Appl. No. 13/852,476, filed Mar. 28, 2013, in the name of Aditya Rajagopal.
Restriction Requirement mailed on May 27, 2014 for U.S. Appl. No. 13/852,480, filed Mar. 28, 2013, in the name of Aditya Rajagopal.
Notice of Allowance mailed on Jul. 3, 2014 for U.S. Appl. No. 13/852,480, filed Mar. 28, 2013, in the name of Aditya Rajagopal.
Restriction Requirement issued for U.S. Appl. No. 12/860,723 filed on Aug. 20, 2010 in the name of Axel Scherer et al. mail date: Jul. 31, 2012.
Non-Final Office Action issued for U.S. Appl. No. 12/860,723 filed on Aug. 20, 2010 in the name of Axel Scherer et al. mail date: Oct. 24, 2012.
Final Office Action issued for U.S. Appl. No. 12/860,723 filed on Aug. 20, 2010 in the name of Axel Scherer et al. mail date: Apr. 16, 2013.
Notice of Allowance mailed on May 12, 2014 for U.S. Appl. No. 12/860,723, filed Aug. 20, 2010, in the name of Axel Scherer et al.
Notice of Allowance mailed on Sep. 12, 2013 for U.S. Appl. No. 12/860,723, filed Aug. 20, 2010, in the name of Axel Scherer et al.
Final Office Action mailed on Jul. 15, 2014 issued for U.S. Appl. No. 13/764,620, filed Feb. 11, 2013, in the name of Seheon Kim.
Non-Final Office Action mailed on Feb. 20, 2014 for U.S. Appl. No. 13/764,620, filed Feb. 11, 2013, in the name of Seheon Kim.

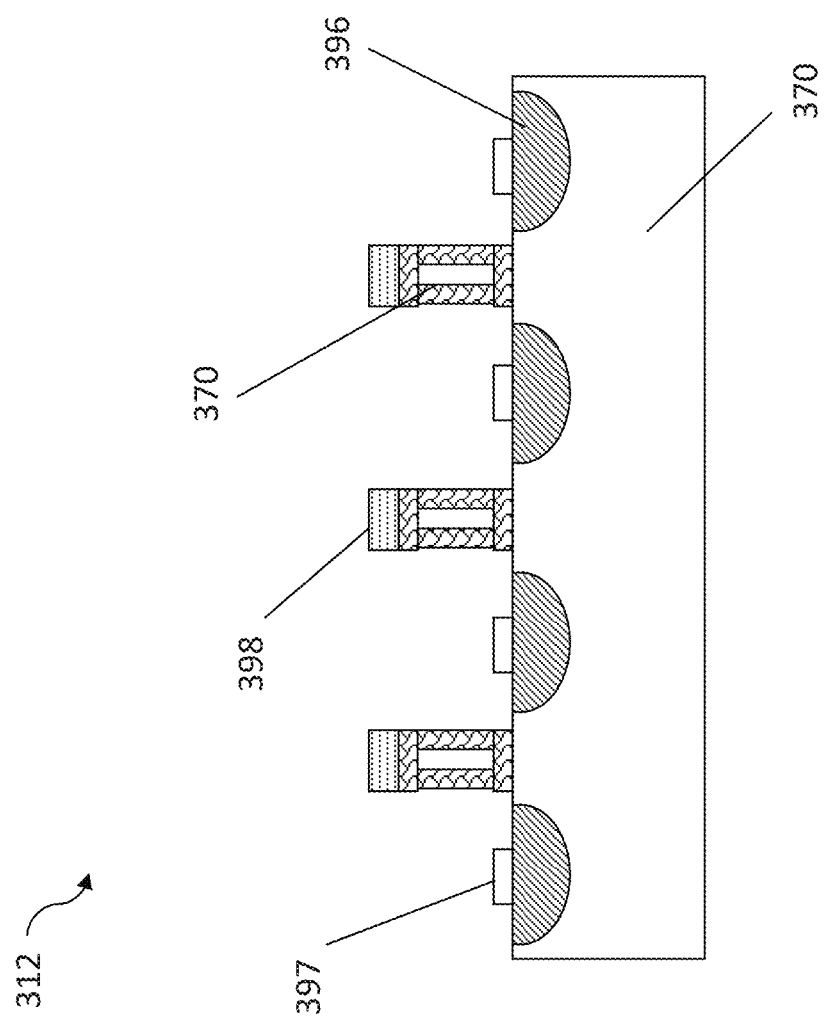

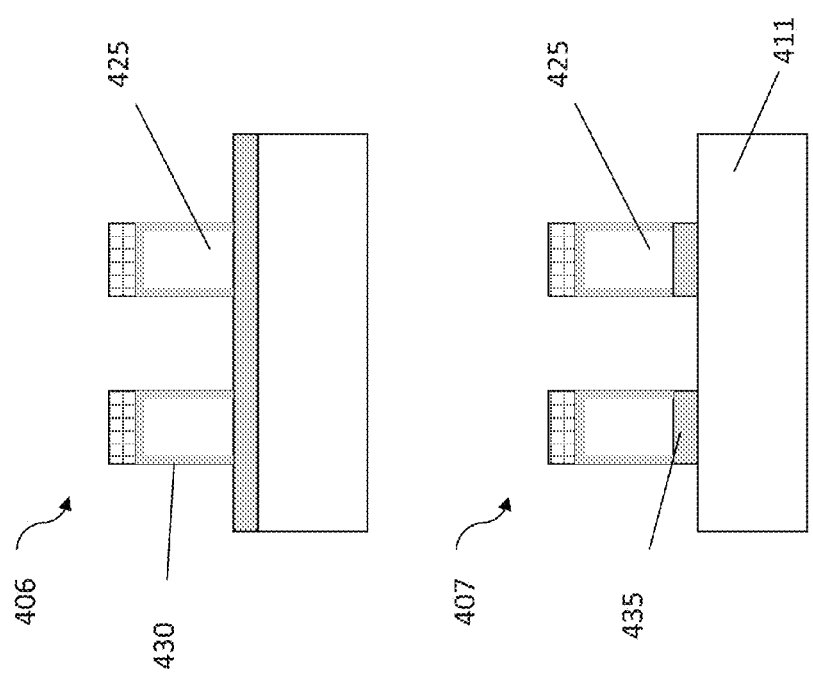

ial, thereby exposing selected regions of the semiconductor substrate, based on the masking pattern; depositing a second masking material on the first masking material and on the semiconductor substrate; removing the first masking material and unwanted regions of the second masking material, based on the masking pattern; etching an array of nanopillars in the semiconductor substrate, based on the masking pattern, wherein the etching is carried out up to a depth of the insulator layer, thereby obtaining a gate oxide layer between the semiconductor substrate and a bottom side of the array of nanopillars; oxidizing the array of nanopillars; removing regions of the insulator layer, wherein the regions of the insulator layer are not covered by the array of nanopillars; defining at least one source region and at least one drain region, by doping the semiconductor substrate; annealing the at least one source region and the at least one drain region; removing the second masking material; depositing metal electrodes on the at least one source region, the at least one drain region, and the top of each nanopillar of the array of nanopillars.

NANOPILLAR FIELD-EFFECT AND JUNCTION TRANSISTORS

CROSS REFERENCE TO RELATED APPLICATIONS

The present application claims priority to U.S. Provisional Patent Application No. 61/724,618, filed on Nov. 9, 2012, and may be related to US Patent Application No. U.S. Ser. No. 13/852,480, filed Mar. 28, 2013, the disclosure of which is incorporated herein by reference in their entirety.

TECHNICAL FIELD

The present disclosure relates to methods for fabricating semiconductor structures. More particularly, it relates to nanopillar field-effect transistors.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 2 and FIGS. 3A-3D depict a series of steps to fabricate a nanopillar MOSFET, according to one embodiment of the disclosure.

FIGS. 4A-4B depict a series of steps to fabricate a nanopillar MOSFET, according to a second embodiment of the disclosure.

SUMMARY

Figure 1:
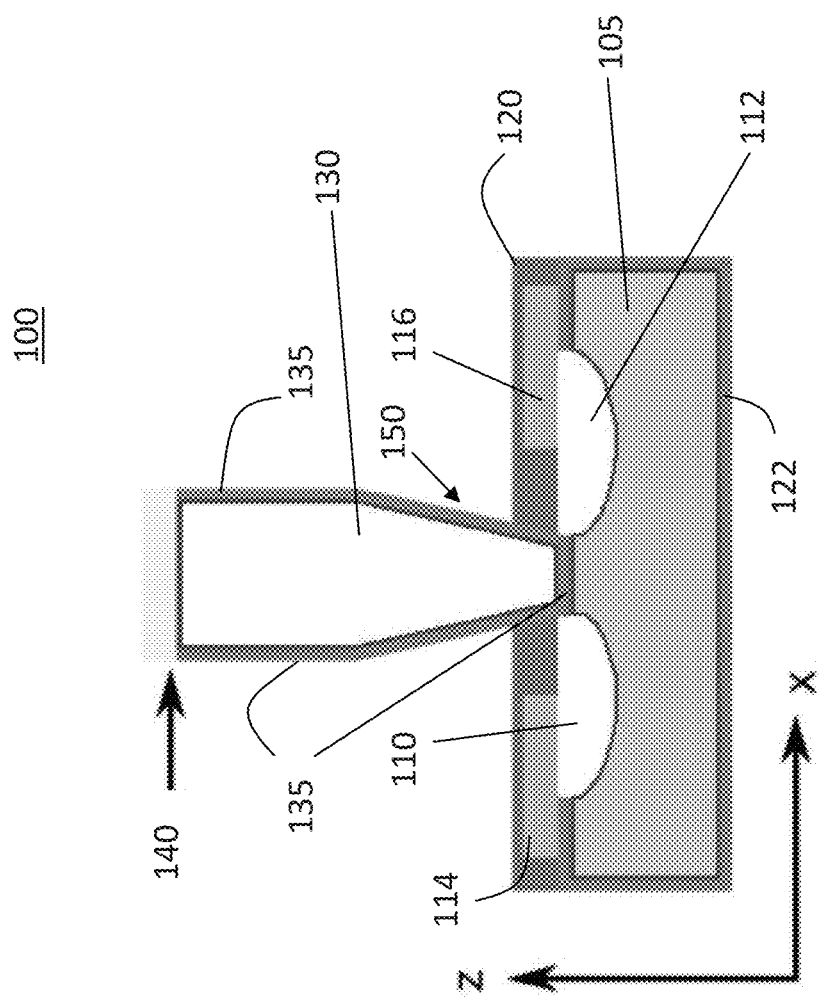
FIG. 1 depicts a cross-section geometry of an exemplary embodiment of a nanopillar field-effect transistor.

According to a first aspect of the disclosure, a method for fabricating a nanopillar field effect transistor is described, the method comprising: providing a semiconductor substrate; depositing a first masking material on the semiconductor substrate; defining a masking pattern on the first masking material; removing selected regions of the first masking material, based on the masking pattern, thereby exposing selected regions of the semiconductor substrate, based on the masking pattern; depositing a second masking material on the first masking material and on the semiconductor substrate; removing the first masking material and unwanted regions of the second masking material, based on the masking pattern; etching an array of nanopillars in the semiconductor substrate, based on the masking pattern; depositing silicon nitride on the semiconductor substrate and on the array of nanopillars; depositing a third masking material on the semiconductor substrate, wherein the height of the third masking material is lower than the height of the array of nanopillars, thereby covering the silicon nitride deposited on the semiconductor substrate but not covering the silicon nitride deposited on the array of nanopillars; etching the silicon nitride deposited on the array of nanopillars; removing the third masking material; oxidizing the array of nanopillars, thereby obtaining a gate oxide layer between the semiconductor substrate and a bottom side of the array of nanopillars; defining at least one source region and at least one drain region, by doping the semiconductor substrate; annealing the at least one source region and the at least one drain region; removing the second masking material; depositing metal electrodes on the at least one source region, the at least one drain region, and the top of each nanopillar of the array of nanopillars.

According to a second aspect of the disclosure, a method for fabricating a nanopillar field effect transistor is described, the method comprising: providing a semiconductor substrate, the semiconductor substrate comprising a first semiconductor layer, an insulator layer, and a second semiconductor layer; depositing a first masking material on the second semiconductor layer; defining a masking pattern on the first masking material; removing selected regions of the first masking material, thereby exposing selected regions of the semiconductor substrate, based on the masking pattern; depositing a second masking material on the first masking material and on the semiconductor substrate; removing the first masking material and unwanted regions of the second masking material, based on the masking pattern; etching an array of nanopillars in the semiconductor substrate, based on the masking pattern, wherein the etching is carried out up to a depth of the insulator layer, thereby obtaining a gate oxide layer between the semiconductor substrate and a bottom side of the array of nanopillars; oxidizing the array of nanopillars; removing regions of the insulator layer, wherein the regions of the insulator layer are not covered by the array of nanopillars; defining at least one source region and at least one drain region, by doping the semiconductor substrate; annealing the at least one source region and the at least one drain region; removing the second masking material; depositing metal electrodes on the at least one source region, the at least one drain region, and the top of each nanopillar of the array of nanopillars.

DESCRIPTION OF EXAMPLE EMBODIMENTS

Field effect transistors (FETs) are an important building block in microelectronics. In the present disclosure methods are described to fabricate field effect transistors where the gate comprises a high height-to-width ratio structure. Such transistors may have a variety of applications, for example detection of chemical or biological molecules.

Nano-scale fabrication allows for the fabrication of transistors in various shapes and sizes. For instance, silicon features can be etched in high height:width aspect ratios. Nanopillar structures with aspect ratios ranging from 1:1 to 100:1 can be used to create high surface area contacts. A high surface area contact can be advantageous, for example, for molecular sensing applications. These transistors structures can be further shaped to create a variety of three-dimensional geometries. Some geometries can be more efficient at sensing certain molecules, or in specific sensing environments. Nanopillar transistors can be fabricated by standard semiconductor fabrication techniques, commonly known to the person skilled in the art.

FIG. 1 illustrates an embodiment of a nanopillar metal-oxide-semiconductor field-effect transistor (MOSFET) (100). The transistor (100) can be fabricated using standard CMOS fabrication techniques, as well as innovative techniques in pinch-off oxidation and electron-beam annealing of dopants which are known to the person skilled in the art.

The structure (100) of FIG. 1 is fabricated on a semiconductor substrate (105). For example, a silicon substrate can be used, but also other semiconductors can be used as understood by the person skilled in the art. The structure (100) includes a source (110) and a drain (112). The source (110) and drain (112) may be fabricated, for example, by doping the substrate (105). The source (110) and drain (112) can be contacted electrically by electrical interconnects (114) for the source and (116) for the drain. For example, contacts (114) and (116) may be fabricated with metals.

A passivation layer (120) prevents unwanted electrical conduction with contacts (114) and (116). An insulating layer (122) may surround the substrate (105) for insulating purposes. By way of example and not of limitation, the insulating layer (122) may be silicon oxide, for the case of silicon substrates.

The gate structure (130) of the MOSFET (100) can have different geometries. The example of FIG. 1 is intended as exemplary, and other shapes can be used. Different height:width aspect ratios may be used, depending on the application. The gate (130) can be surrounded by an insulating layer (135), for example silicon oxide for the case of silicon substrates. The structure (100) comprises a gate electrode (140).

In one embodiment of a method to fabricate MOSFETs, it is possible to fabricate nanopillar field effect transistors with a gate oxide thickness of less than 100 nm. In this method, silicon nitride ($Si_3N_4$) may be used to restrict the areas of pillar oxidation. A pinch-off geometry may also be defined at the base of the pillars. The use of silicon nitride and/or a pinch-off geometry allows the fabrication of a gate oxide with reduced thickness in comparison with other techniques. This result can be achieved due to self-terminating oxidation. What is intended as pinch-off geometry can be understood, for example, from FIG. 1, where the region (150) is tapered to give a base (135) for the nanopillar which is narrower than the top (140). The base (135) is then 'pinched-off' compared to the top (140).

Wafers with an embedded oxide layer may be used for the fabrication of nanopillar transistors. Silicon on insulator wafers (SOI), silicon deposited on oxidized Si wafers, etc. can be the starting substrate of the fabrication method of the disclosure. The thickness of the top Si layer and the embedded oxide layer may be designed to be close to the pillar height and the final gate oxide thickness, respectively.

As it is known by the person skilled in the art, the thickness of the gate oxide of a FET directly affects the threshold voltage of the transistor, which in turn determines the sensitivity of the transistor, for example for molecular detection.

Figure 2:
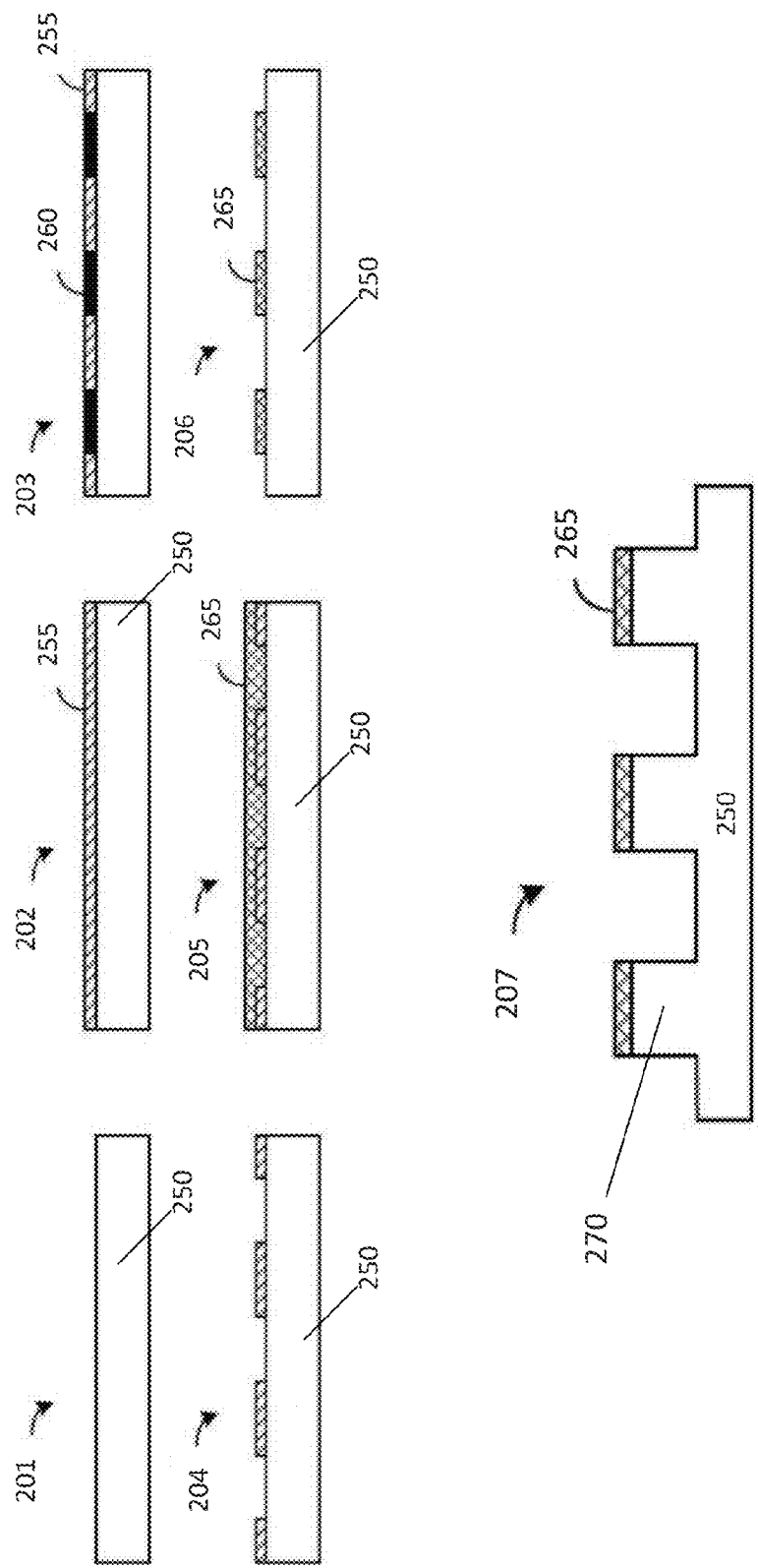

Referring to FIG. 2, the initial steps are described, for an exemplary method to fabricate nanopillar MOSFETs.

In step 201, a highly doped silicon wafer (250) is spin coated with a polymer (spin coating is not shown as it is well known in the art). In one example embodiment, the polymer may be poly-methyl-methacrylate (PMMA).

In stage (202), a soft mask (255) is written into the polymer using, for example, electron beam lithography. The resulting mask pattern is shown in stage (203), where the dark shaded areas (260) indicate areas in which material is to be removed in subsequent stages of fabrication.

In stage (204), a polymer development procedure is performed (well known in the art), followed, in stage (205), by deposition of an alumina film (265). The alumina film may be deposited, for example, by sputtering. In one embodiment, the alumina film is about 45 nm thick. Other deposition techniques may be used, as understood by the person skilled in the art, for example RF sputtering may be used to deposit stoichiometric $Al_2O_3$.

In stage (206), excess alumina and polymer are removed, leaving behind a hard etch-mask (265) that is in direct contact with the silicon wafer (250). In one example embodiment, excess alumina and polymer may be removed by lift-off in dichloromethane.

In stage (207), a plurality of silicon nano-pillars (270) are defined using, for example, deep reactive ion etching techniques. Each of the plurality of silicon nano-pillars may be used to fabricate an individual gate terminal of an individual nano-pillar field-effect transistor. Side-wall passivation may be achieved by using cryogenic cooling of the sidewalls of the nano-pillars. In one example implementation, the cryogenic cooling temperature is about −140° Celsius. A 90 sccm:10 sccm $SF_6:O_2$ gas ratio may be used during the etching. An inductively coupled plasma power of 1800 W and a forward power of about 5 W may be used to define silicon nanopillars that are between 100 nm and 10 microns tall. The height may be selected in order to provide aspect ratios (height:width) extending up to 100:1.

At the end of state (207), an array of nanopillars (270) has been etched in the substrate (250) through an alumina hard mask (265).

Figure 3A:
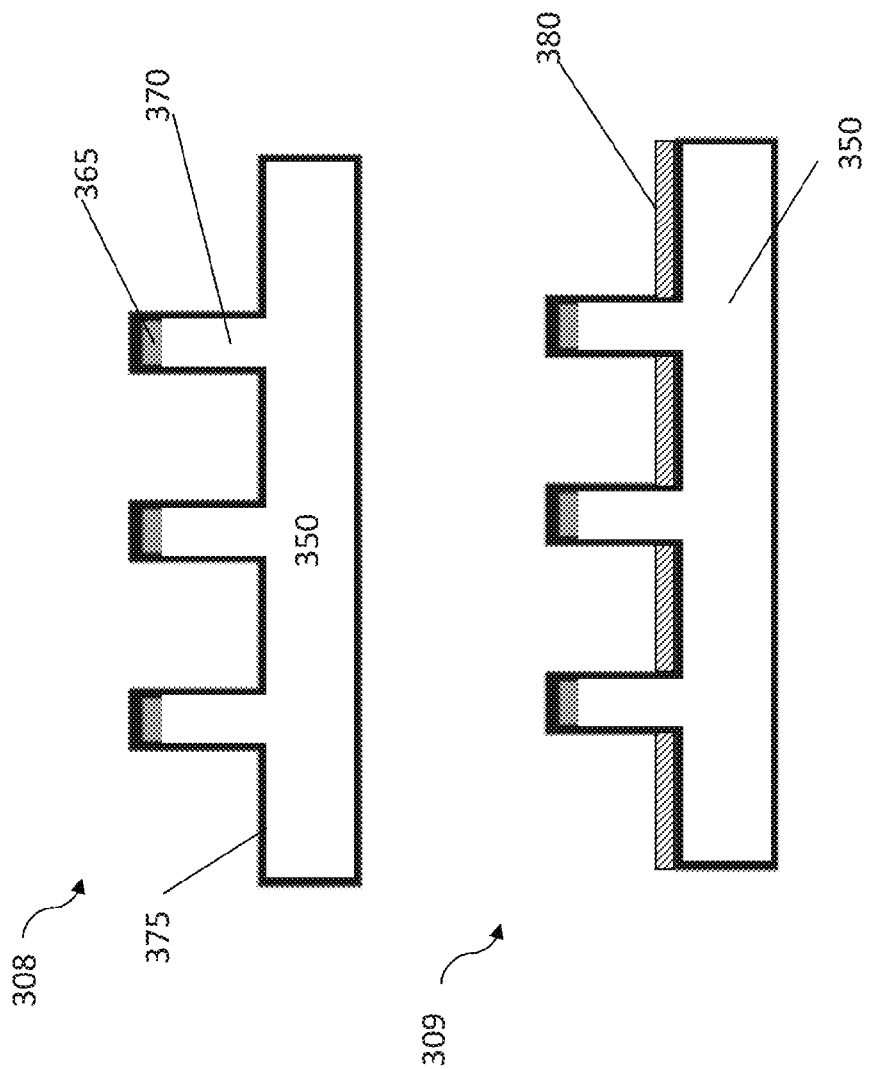

Referring now to FIG. 3A, the fabrication steps following those of FIG. 2 are described. In FIG. 3A, the substrate (350) comprises the array of nanopillars (370), etched in the substrate through an alumina hard mask (365). At this stage (308), a layer of silicon nitride ($Si_3N_4$) is deposited on the wafer, for example by low-pressure chemical vapor deposition (LPCVD), or another available technique.

In the following step (309), a thin protective layer (380) is spin-coated at a desired thickness, for example poly(methyl methacrylate) (PMMA) could be used. Exposed silicon nitride can then be etched away, for example by phosphoric acid, while the silicon nitride which is protected by PMMA will not be touched by the etching process. The effect is exposing the nanopillars while the substrate remains covered by silicon nitride, as visible in step (310) of FIG. 3B.

Figure 3B:
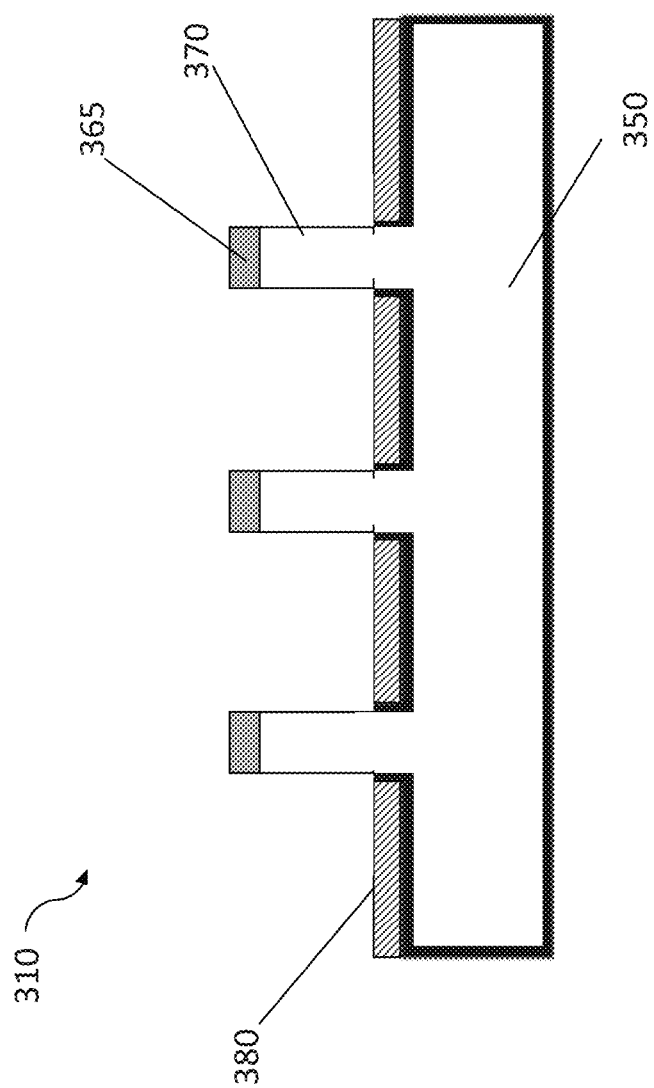

Referring to FIG. 3B, step (310), the nanopillars (370) and alumina hard mask (365) are exposed after their silicon nitride layer has been etched away. Subsequently, the PMMA layer (380) is stripped, for example by chemical dissolution, and the entire wafer (350) is placed into a furnace for oxidation. During oxidation, the silicon nitride acts as an oxidation mask. As a consequence, only portions not covered with $Si_3N_4$ will be oxidized, as can be seen in step (311) of FIG. 3C.

Figure 3C:
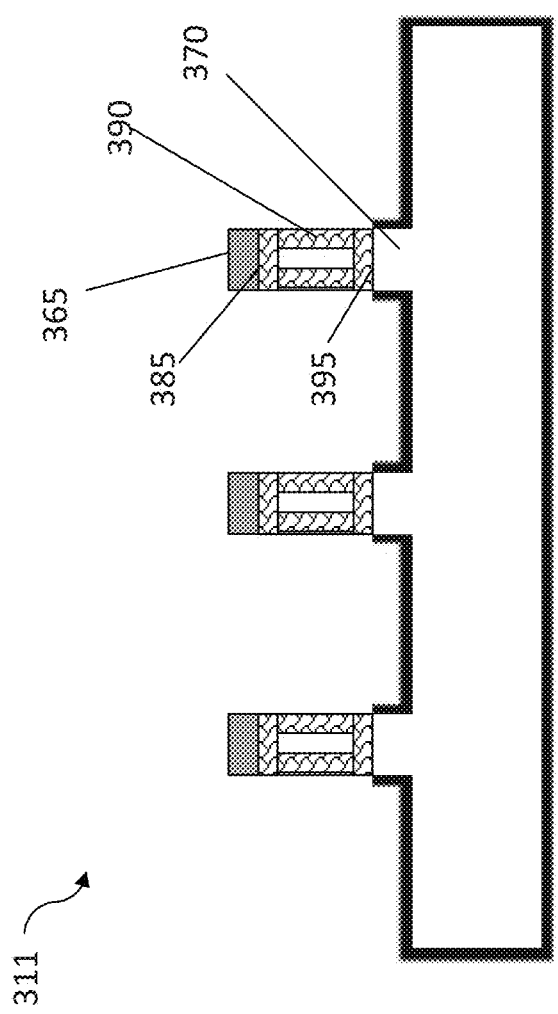

In FIG. 3C, the nanopillars (370) have been oxidized all around: on the sides (390), on the top side (385) close to the alumina hard mask (365), and on the bottom side (395).

Subsequently, referring to step (312) of FIG. 3D, doped regions (396) are defined in the substrate (350) and annealed for the source and drain of each MOSFET, and contact metal electrodes (397) are deposited on top of the doped areas (396). Gate electrodes (398) are also deposited on top of the nanopillars (370). Doping might be achieved, for example, by focused ion beam lithography. Annealing may be performed, in one embodiment, by electron beam. Electron beam evaporation may be used to deposit metallic electrodes.

In another embodiment of the method of the present disclosure, the fabrication process begins with a wafer with an embedded layer of oxide, the thickness of which is designed to be close to that of the final gate oxide. The thickness of the top Si layer is also designed to be close to the final pillar height. The implementation methods include, but are not limited to, using a silicon on insulator (SOI) wafer, depositing Si on top of an oxidized silicon wafer (through evaporation, sputtering, chemical vapor deposition, etc.), and then proceeding with steps similar to those described in FIGS. 2 and 3A to 3D. This embodiment of the method is described beginning from FIG. 4A.

Figure 4A:
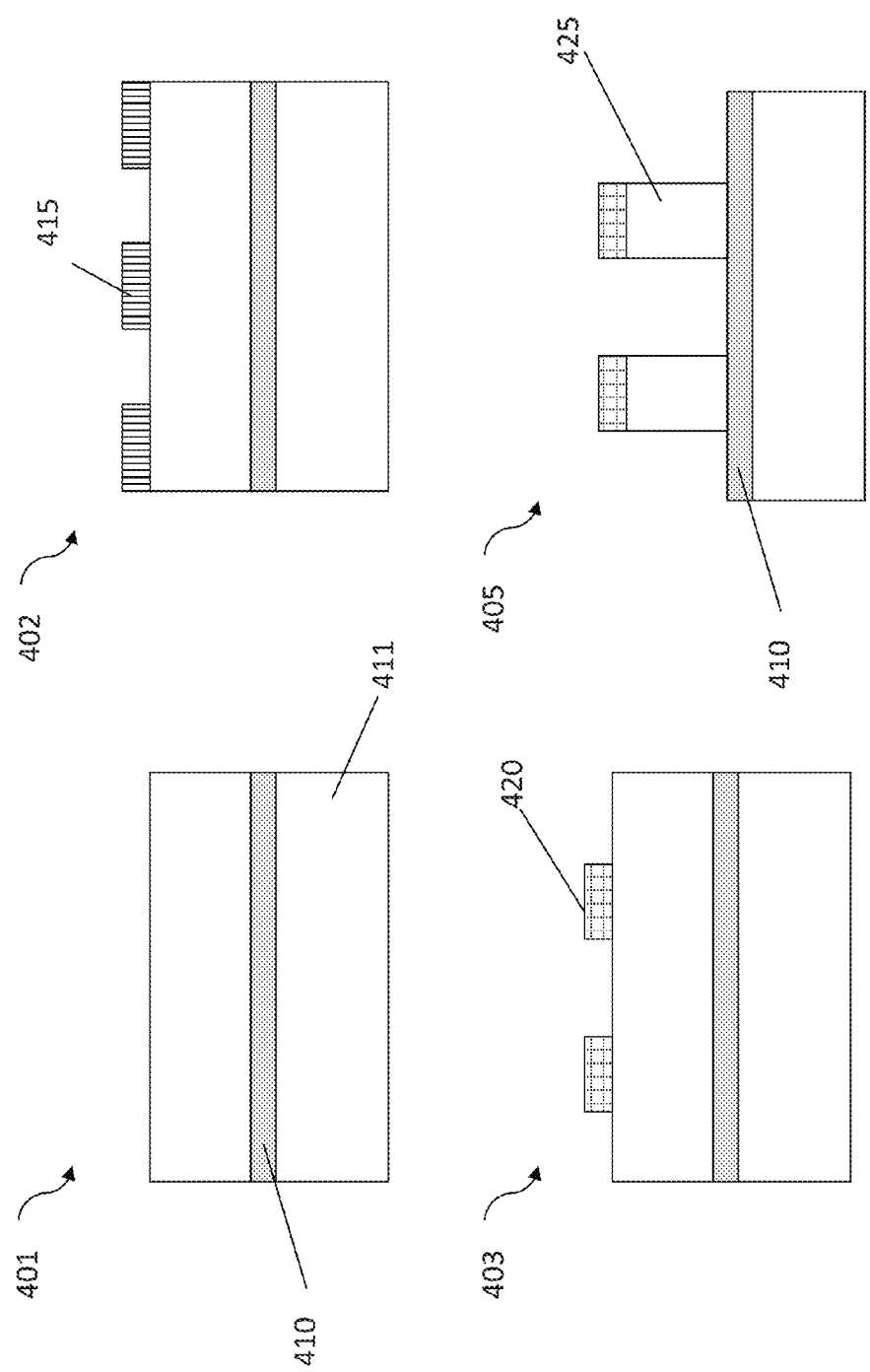

Referring to FIG. 4A, in step (401) a SOI substrate (411) is provided, with an embedded oxide layer (410). In step (402), PMMA (415) is deposited and patterned by standard lithographic techniques. In step (403), an alumina hard mask (420) is deposited and the PMMA lifted off by standard lithographic techniques.

In step (405), silicon is etched up to the embedded oxide layer (410), thereby creating an array of nanopillars (425).

Referring now to FIG. 4B, in the next step (406), the nanopillars are oxidized, similarly to step (311) of FIG. 3C.

In FIG. 4B, a layer of oxide (430) surrounds the nanopillars (425). In the following step (407), the oxide layer in the areas between the nanopillars is removed, for example by etching. Therefore, only oxide layer (435) remains between the nanopillars (425) and the substrate (411), acting as gate oxide for the transistors. Finally, doped regions and contact metal electrodes are deposited similarly to step (312) of FIG. 3D.

Since the nanopillar transistors can be compatible with CMOS fabrication techniques, a monolithic integration of functionalized transistors with conventional electronics on single semiconducting substrate is possible.

The examples set forth above are provided to those of ordinary skill in the art a complete disclosure and description of how to make and use the embodiments of the gamut mapping of the disclosure, and are not intended to limit the scope of what the inventor/inventors regard as their disclosure.

Modifications of the above-described modes for carrying out the methods and systems herein disclosed are obvious to persons of skill in the art and are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. Accordingly, other embodiments are within the scope of the following claims.

What is claimed is:

1. A method for fabricating a nanopillar field effect transistor, the method comprising:
   providing a semiconductor substrate;
   depositing a first masking material on the semiconductor substrate;
   defining a masking pattern on the first masking material;
   removing selected regions of the first masking material, based on the masking pattern, thereby exposing selected regions of the semiconductor substrate, based on the masking pattern;
   depositing a second masking material on the first masking material and on the semiconductor substrate;
   removing the first masking material and unwanted regions of the second masking material, based on the masking pattern;
   etching an array of nanopillars in the semiconductor substrate, based on the masking pattern;
   depositing silicon nitride on the semiconductor substrate and on the array of nanopillars;
   depositing a third masking material on the semiconductor substrate, wherein the height of the third masking material is lower than the height of the array of nanopillars, thereby covering the silicon nitride deposited on the semiconductor substrate but not covering the silicon nitride deposited on the array of nanopillars;
   etching the silicon nitride deposited on the array of nanopillars;
   removing the third masking material;
   oxidizing the array of nanopillars, thereby obtaining a gate oxide layer between the semiconductor substrate and a bottom side of the array of nanopillars;
   defining at least one source region and at least one drain region, by doping the semiconductor substrate;
   annealing the at least one source region and the at least one drain region;
   removing the second masking material;
   depositing metal electrodes on the at least one source region, the at least one drain region, and the top of each nanopillar of the array of nanopillars.

2. The method of claim 1, wherein the semiconductor substrate is highly doped.

3. The method of claim 1, wherein the first masking material is PMMA.

4. The method of claim 1, wherein the defining a masking pattern is carried out by electron beam lithography.

5. The method of claim 1, wherein the second masking material is alumina.

6. The method of claim 1, wherein the etching an array of nanopillars is carried out with deep reactive ion etching.

7. The method of claim 1, wherein the depositing of silicon nitride is carried out by low-pressure chemical vapor deposition.

8. The method of claim 1, wherein the third masking material is PMMA.

9. The method of claim 1, wherein the etching the silicon nitride is carried out with phosphoric acid.

10. The method of claim 1, wherein the oxidizing is carried out in a furnace.

11. The method of claim 1, wherein the defining at least one source region and at least one drain region is carried out by focused ion beam lithography.

12. The method of claim 1, wherein the annealing is carried out by electron beam.

13. The method of claim 1, wherein a thickness of the gate oxide is less than 100 nm.

14. The method of claim 1, wherein a height-to-width aspect ratio of the array of nanopillars is greater than 50.

15. The method of claim 1, wherein the shape of each nanopillar of the array of nanopillars comprises a cylindrical shape, a rectangular shape, or a tapered shape.

16. A method for fabricating a nanopillar field effect transistor, the method comprising:
   providing a semiconductor substrate, the semiconductor substrate comprising a first semiconductor layer, an insulator layer, and a second semiconductor layer;
   depositing a first masking material on the second semiconductor layer;
   defining a masking pattern on the first masking material;
   removing selected regions of the first masking material, thereby exposing selected regions of the semiconductor substrate, based on the masking pattern;
   depositing a second masking material on the first masking material and on the semiconductor substrate;
   removing the first masking material and unwanted regions of the second masking material, based on the masking pattern;
   etching an array of nanopillars in the semiconductor substrate, based on the masking pattern, wherein the etching is carried out up to a depth of the insulator layer, thereby obtaining a gate oxide layer between the semiconductor substrate and a bottom side of the array of nanopillars;

oxidizing the array of nanopillars;

removing regions of the insulator layer, wherein the regions of the insulator layer are not covered by the array of nanopillars;

defining at least one source region and at least one drain region, by doping the semiconductor substrate;

annealing the at least one source region and the at least one drain region;

removing the second masking material;

depositing metal electrodes on the at least one source region, the at least one drain region, and the top of each nanopillar of the array of nanopillars.

17. The method of claim 16, wherein the first semiconductor layer and the second semiconductor layer are silicon and the insulator layer is silicon oxide.

18. The method of claim 16, wherein a thickness of the insulator layer is chosen to be substantially equal to a desired thickness of the gate oxide, and the thickness of the second semiconductor layer is chosen to be substantially equal to a desired height of the array of nanopillars.

19. The method of claim 16, wherein the first semiconductor layer and/or the second semiconductor layer are highly doped.

20. The method of claim 16, wherein the first masking material is PMMA.

21. The method of claim 16, wherein the defining a masking pattern is carried out by electron beam lithography.

22. The method of claim 16, wherein the second masking material is alumina.

23. The method of claim 16, wherein the etching an array of nanopillars is carried out with deep reactive ion etching.

24. The method of claim 16, wherein the oxidizing is carried out in a furnace.

25. The method of claim 16, wherein the defining at least one source region and at least one drain region is carried out by focused ion beam lithography.

26. The method of claim 16, wherein the annealing is carried out by electron beam.

27. The method of claim 16, wherein a thickness of the insulator layer is less than 100 nm.

28. The method of claim 16, wherein a height-to-width aspect ratio of the array of nanopillars is greater than 50.

29. The method of claim 16, wherein the shape of each nanopillar of the array of nanopillars comprises a cylindrical shape, a rectangular shape, or a tapered shape.

* * * * *